(12) United States Patent
Kuriki et al.

(10) Patent No.: US 6,264,748 B1
(45) Date of Patent: Jul. 24, 2001

(54) SUBSTRATE PROCESSING APPARATUS

(75) Inventors: Yasuyuki Kuriki, Tokyo; Hideyuki Takamori, Kumamoto; Kozo Hara, Yamanashi-ken, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/130,104

(22) Filed: Aug. 6, 1998

(30) Foreign Application Priority Data

Aug. 15, 1997 (JP) ................................... 9-233287
Aug. 15, 1997 (JP) ................................... 9-233288

(51) Int. Cl.[7] ................................................. C23C 16/00
(52) U.S. Cl. ........................ 118/719; 118/715; 118/719; 156/345 L; 156/345 V; 156/345 ML; 156/345 MT
(58) Field of Search .................................... 118/719, 715; 156/347, 345 L, 345 V, 345 MT, 345 ME

(56) References Cited

U.S. PATENT DOCUMENTS

| | | | |
|---|---|---|---|
| 5,177,514 | * | 1/1993 | Ushijima et al. ..................... 354/319 |
| 5,292,393 | * | 3/1994 | Maydan et al. ....................... 156/345 |
| 5,820,679 | * | 10/1998 | Yokohama et al. .................. 118/719 |
| 5,885,403 | * | 3/1999 | Cheng .................................. 156/345 |
| 5,885,681 | * | 1/1999 | Maydan et al. ...................... 118/719 |

FOREIGN PATENT DOCUMENTS 1-174920  12/1989  (JP) .
4-115513   4/1992  (JP) .

* cited by examiner

Primary Examiner—Deborah Jones
Assistant Examiner—Lymarle Miranda
(74) Attorney, Agent, or Firm—Oblon, Spivak, McClelland, Maier & Neustadt, P.C.

(57) ABSTRACT

A substrate processing apparatus comprises a processing section having a plurality of process units for applying a series of processes including a resist coating to a processing substrate, a developing process to an exposed substrate, and an etching to the developed processing substrate, a main transferring mechanism, moving along a transferring path, for transferring/receiving the processing substrate to/from the respective process units, and a loading/unloading portion having a transferring/receiving mechanism for transferring/receiving the processing substrate to/from the main transferring apparatus, wherein these process units, the transferring path, and the loading/unloading portion are integrally provided.

35 Claims, 13 Drawing Sheets

SUBSTRATE PROCESSING APPARATUS

BACKGROUND OF THE INVENTION

1. Field of the Invention

The present invention relates to a substrate processing apparatus for applying a resist coating and developing processes to a substrate such as an LCD glass substrate, a semiconductor wafer, etc, and an etching process to the developed substrate.

2. Discussion of the Background

In the manufacture of liquid crystal displays (LCD) and semiconductor devices, a predetermined film is formed on an LCD glass substrate or a semiconductor wafer. Thereafter, the resultant film is coated with photo resist liquid to form a resist film, and the resist film is exposed corresponding to a circuit pattern, and developed. This is the so-called lithography technique by which a circuit pattern is formed. Thereafter, an etching process is applied to the substrate to form a wire circuit.

Conventionally, there is adopted a layout in which the apparatuses performing each of such processes are intensively provided. In many cases, processing apparatuses for dry systems and processing apparatuses for wet systems are laid out to be separated from each other. Particularly, a cleaning process, which is performed after etching, is a wet process, and the unit for such a cleaning process is intensively provided at a position separating from a dry etching unit.

Regarding resist coating and developing, there is often used an apparatus in which a plurality of process units for performing a series of processes are combined. Even in this case, a coating/developing unit, a film forming unit and an etching unit are separately provided.

Each of the process units for performing the respective processes is thus intensively provided, and this arrangement is seemingly efficient. However, in consideration of a series of processes applied to one substrate, a transferring distance of the substrate extremely increases, thereby bringing about an inefficient result.

A vacuum process system such as a film forming process, an etching process and an ashing process, etc., and a cleaning unit and a resist coating/developing process units are provided at positions which are completely separated from each other. Therefore, for example, when the developing process, the etching process, and the ashing process are sequentially performed, thereafter the substrate is cleaned, and when the substrate is cleaned before or after the film forming process, the substrate transferring distance extremely increases, thereby bringing about an inefficient result.

BRIEF SUMMARY OF THE INVENTION

An object of the present invention is to provide a substrate processing apparatus capable of applying a series of processes to a substrate at high efficiency without increasing a substrate transferring distance.

Another object of the present invention is to provide a substrate processing apparatus capable of applying a vacuum process and a process corresponding to a pre-process and/or a post-process of the vacuum process at high efficiency without increasing a substrate transferring distance.

According to a first aspect of the present invention, there is provided a substrate processing apparatus comprising:
 a processing section having a plurality of process units for applying a series of processes including a resist coating to a substrate to be processed, a developing to an exposed substrate, and an etching to the developed substrate; and
 a substrate transferring mechanism for transferring/receiving the processing substrate to/from respective process units of the processing section, wherein the plurality of process units is integrally provided.

According to a second aspect of the present invention, there is provided a substrate processing apparatus comprising:
 a transferring path;
 a processing section, provided along the transferring path, having a plurality of process units for applying a series of processes including a resist coating to a substrate to be processed, a developing to an exposed substrate, and an etching to the developed substrate; and
 a substrate transferring mechanism, provided to move along the transferring path, for transferring/receiving the substrate to/from respective process units of the processing section, wherein the plurality of process units and the transferring path are integrally provided.

According to a third aspect of the present invention, there is provided a substrate processing apparatus comprising:
 a processing section, provided along a transferring path, portion having a plurality of process units for applying a series of processes including a resist coating to a substrate to be processed, a developing to an exposed substrate, and an etching to the developed substrate;
 a substrate transferring mechanism, provided to move along the transferring path, for transferring/receiving the processing substrate to/from respective process units of the processing section; and
 a loading/unloading portion having a transferring/receiving mechanism for transferring/receiving the substrate to/from the substrate transferring mechanism, wherein the plurality of process units, the transferring path, and the loading/unloading portion are integrally provided.

According to a fourth aspect of the present invention, there is provided a substrate processing apparatus comprising:
 a processing section having a plurality of process units for applying a series of processes including a film forming process for forming a thin film on a substrate to be processed, a resist coating to the substrate, a developing to an exposed substrate, and an etching to the developed substrate; and
 a substrate transferring mechanism for transferring/receiving the substrate to/from respective process units of the processing section, wherein the plurality of process units is integrally provided.

According to a fifth aspect of the present invention, there is provided a substrate processing apparatus comprising:
 a transferring path;
 a processing section, provided along the transferring path, having a plurality of process units for applying a series of processes including a film forming for forming a thin film on a substrate to be processed, a resist coating to the substrate, a developing to an exposed substrate, and an etching to the developed substrate; and
 a substrate transferring mechanism for transferring/receiving the processing substrate to/from the respective process units of the processing section, wherein the plurality of process units and the transferring path are integrally provided.

According to a sixth aspect of the present invention, there is provided a substrate processing apparatus comprising:
- a processing section, provided along a transferring path, having a plurality of process units for applying a series of processes including a film forming for forming a thin film on a substrate to be processed, a resist coating to the substrate, a developing to an exposed substrate, and an etching to the developed substrate;
- a substrate transferring mechanism, provided to move along the transferring path, for transferring/receiving the processing substrate to/from respective process units of the processing section; and
- a loading/unloading portion having a transferring/receiving mechanism for transferring/receiving the substrate to/from the substrate transferring mechanism, wherein the plurality of process units, the transferring path, and the loading/unloading portion are integrally provided.

According to a seventh aspect of the present invention, there is provided a substrate processing apparatus comprising:
- a first process block having at least a cleaning process unit for cleaning a substrate to be processed and an etching process unit for applying an etching process to the substrate, which are provided along a first transferring path;
- a second process block having at least a resist coating unit for applying a resist coating to the substrate and a heat process unit for applying a heat process to the substrate, which are provided along a second transferring path;
- a third process block having at least a developing process unit for applying a developing process to the exposed substrate and a heat process unit for applying a heat process to the substrate, which are provided along a third transferring path; and
- a substrate transferring mechanism, provided to move on each of the transferring paths, having a transferring arm for transferring/receiving the substrate to/from the respective process units, wherein the process blocks are integrally provided.

According to an eighth aspect of the present invention, there is provided a substrate processing apparatus comprising:
- a processing section having a plurality of process units for applying a series of processes including a resist coating to a substrate to be processed and a developing to an exposed substrate, and an etching to the developed substrate after exposing;
- a substrate transferring mechanism for transferring/receiving the substrate to/from respective process units of the processing section; and
- a loading/unloading portion having a transferring/receiving mechanism for transferring/receiving the substrate to/from the substrate transferring mechanism, the processing section comprising:
  - a first process block having at least a cleaning process unit for cleaning a processing substrate and an etching process unit for applying an etching process to the processing substrate, which are provided along a first transferring path;
  - a second process block having at least a resist coating unit for applying a resist coating to the substrate and a heat process unit for applying a heat process to the substrate, which are provided along a second transferring path; and
  - a third process block having at least a developing process unit for applying a developing process to an exposed substrate and a heat process unit for applying a heat process to the substrate which are provided along a third transferring path;
  the substrate transferring mechanism having a transferring arm moving on the respective transferring paths, wherein the respective process units of these process blocks, the transferring paths, and the loading/unloading portion are integrally provided.

According to a ninth aspect of the present invention, there is provided a substrate processing apparatus comprising:
- a first process block having at least a film forming process unit for forming a thin film on a substrate and a first transferring path;
- a second process block having at least a cleaning process unit for cleaning the substrate and an etching process unit for applying an etching process to the substrate, which are provided along a second transferring path;
- a third process block having at least a resist coating unit for applying a resist coating to the substrate and a heat process unit for applying a heat process to the substrate, which are provided along a third transferring path;
- a fourth process block having at least a developing process unit for applying a developing process to an exposed substrate and a heat process unit for applying a heat process to the substrate, which are provided along a fourth transferring path; and
- a substrate transferring mechanism, having a transferring arm, moving on each of the transferring paths, for transferring/receiving the substrate to/from the respective process units, wherein the process blocks are integrally provided.

According to a tenth aspect of the present invention, there is provided a substrate processing apparatus comprising:
- a processing section, provided along a transferring path, having a plurality of process units for applying a series of processes including a film forming process for forming a thin film on a substrate to be processed, a resist coating to the substrate, a developing to an exposed substrate, and an etching to the developed processing substrate;
- a substrate transferring mechanism for transferring/receiving the substrate to/from respective process units;
- a loading/unloading portion having a transferring/receiving mechanism for transferring/receiving the processing substrate to/from the substrate transferring mechanism,
  the processing section comprising:
  - a first process block having at least a film forming process unit for forming a thin film on a substrate and a first transferring path;
  - a second process block having at least a cleaning process unit for cleaning the processing substrate and an etching process unit for applying an etching process to the processing substrate, which are provided along a second transferring path;
  - a third process block having at least a resist coating unit for applying a resist coating to the substrate and a heat process unit for applying a heat process to the substrate, which are provided along a third transferring path;
  - a fourth process block having at least a developing process unit for applying a developing process to an exposed substrate and a heat process unit for applying a heat process to the substrate, which are provided along a fourth transferring path; and the substrate transferring mechanism having a transferring arm moving on the respective paths, wherein the process units of these process blocks, transferring paths, and loading/unloading portion are integrally provided.

According to the first to tenth aspects of the present invention, unlike the conventional case, the respective units of the resist coating/developing process, the etching process, and the later cleaning process are not separated to arrange each unit intensively. In other words, a plurality of process units for applying a series of processes including a resist coating to a substrate to be processed and a developing of resist to a substrate after exposing, and an etching to the processing substrate after developing are integrally provided. As a result, the resist coating/developing process and the etching process can be performed at one time by one apparatus, the transferring distance of the substrate in a series of processes can be considerably shortened, and an extremely high efficient processing can be realized. Moreover, the film forming unit for forming a thin film is incorporated into such a processing apparatus. Thereby, the processes including the film forming process to the etching process can be continuously performed, much higher efficient processing can be obtained.

According to an eleventh aspect of the present invention, there is provided a substrate processing apparatus comprising:

a first processing section for applying a vacuum process to a substrate to be processed;

a second processing section having a plurality of process units for performing a process corresponding to a pre-process and/or a post-process of the vacuum process in the first processing section; and a substrate transferring mechanism for transferring/receiving the substrate to/from the respective process units of the second processing section and between the first processing section and the second processing section, wherein the respective units of the second processing section are integrally provided, and the first processing section and the second processing section are integrally provided.

According to a twelfth aspect of the present invention, there is provided a substrate processing apparatus comprising:

a first processing section for applying a vacuum process to a substrate to be processed;

a second processing section having a transferring path and a plurality of process units, provided along the transferring path, for performing a process corresponding to a pre-process and/or a post-process of the vacuum process in the first processing section; and a substrate transferring mechanism, moving along the transferring path, for transferring/receiving the processing substrate to/from the respective process units of the second processing section and between the first processing section and the second processing section, wherein the respective units of the second processing section and the transferring path are integrally provided, and the first processing section and the second processing section are integrally provided.

According to a thirteenth aspect of the present invention, there is provided a substrate processing apparatus comprising:

a first processing section for applying a vacuum process to a substrate to be processed;

a second processing section having a transferring path and a plurality of process units, provided along the transferring path, for performing a process corresponding to a pre-process and/or a post-process of the vacuum process in the first processing section;

a substrate transferring mechanism, moving along the transferring path, for transferring/receiving the substrate to/from the respective process units of the second processing section and between the first processing section and the second processing section; and a loading/unloading portion having a transferring/receiving mechanism for transferring/receiving the processing substrate to/from the substrate transferring mechanism, wherein the respective units of the second processing section and the transferring path are integrally provided, and the first processing section, the second processing section, and the loading/unloading portion are integrally provided.

According to the eleventh to thirteenth aspects of the present invention, unlike the conventional case, the vacuum process unit for performing the vacuum processes such as the etching process and the film forming process, and the process unit for performing the cleaning process and the developing process as the pre-process and/or the post-process are not provided at the separated position. In other words, the first processing section for performing the vacuum process and the second processing section having the plurality of process units for performing the processes corresponding to the pre-process and/or post-process of the vacuum process are integrally provided. As a result, these processes can be continuously performed at one time by one apparatus, the transferring distance of the substrate in a series of processes can be considerably shortened, and an extremely high efficient processing can be realized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

The embodiments of the present invention will now be specifically described with reference to the accompanying drawings.

First Embodiment

Figure 1:
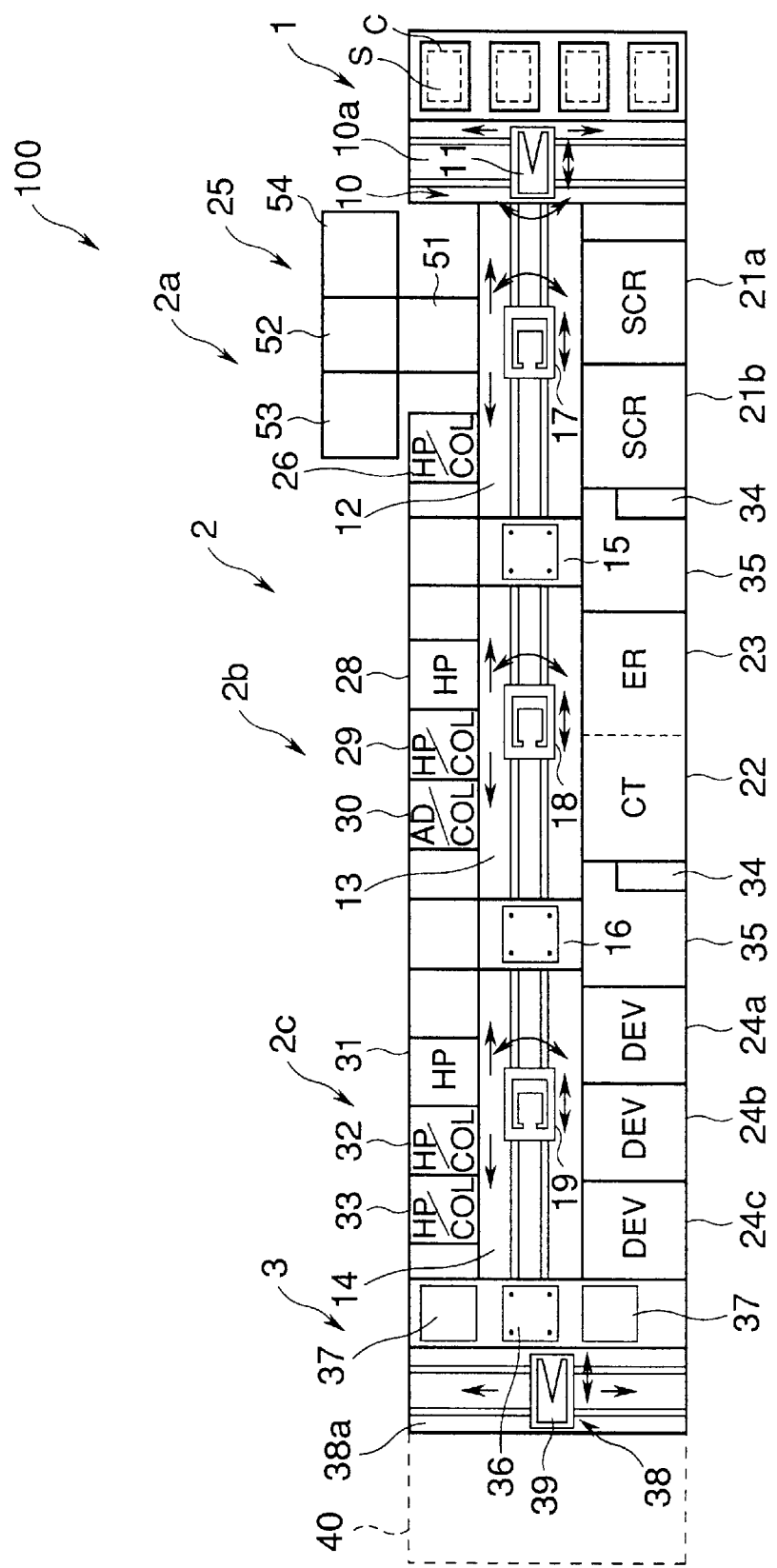
FIG. 1 is a plan view showing a processing system for an LCD substrate according to a first embodiment of the present invention.

FIG. 1 is a plan view showing a processing system for an LCD substrate according to the first embodiment of the present invention.

This processing system comprises a cassette station 1 in which a cassette C to incorporate a plurality of substrates S therein is loaded, a processing section 2 including a plurality of processing units which apply a series of processes including resist coating and developing to an exposed substrates S and an etching process to the developed substrate S, and an interface portion 3 for transferring the substrate S between the processing system and an exposure unit 40.

The cassette station 1 and the interface portion 3 are provided to both ends of the processing section 2, respectively.

The cassette station 1 comprises a transferring section 10 for transferring the LCD substrate between the cassette C and the processing section 2. Loading/unloading the cassette C is carried out in the cassette station 1. In addition, the transferring section 10 comprises transferring mechanism 11, which is movable on transferring paths 10a provided along an alignment direction of the cassettes, and the substrate S can be carried between the cassette C and the processing section 2 by virtue of the transferring mechanism 11.

The processing section 2 is divided into a front stage process block 2a, an intermediate stage process block 2b, and a rear stage process block 2c. In these blocks, transferring paths 12, 13, 14 are provided in their central areas, respectively, and processing units are arranged on both sides of these transferring paths, respectively. Then, relay portions 15, 16 are provided between the front stage process block 2a, the intermediate stage process block 2b, and the rear stage process block 2c, respectively.

The front stage process block 2a comprises a main transferring apparatus 17, which is movable along the transferring path 12. Two scrubber cleaning units (SCR) 21a, 21b are provided to one end side of the transferring path 12. On the other hand, an etching unit 25, which applies etching and ashing processes to the developed substrate S, and a heating/cooling process unit (HP/COL) 26 are provided to the other side of the transferring path 12.

The intermediate stage process block 2b comprises a main transferring apparatus 18, which is movable along the transferring path 13. A resist coating process unit (CT) 22 and an edge remover 23 (ER) for removing the resist on the peripheral portion of the substrate S are continuously provided to one end side of the transferring path 13. On the other hand, two heating/cooling process units (HP/COL) 28, 29, in which a heating process unit and a cooling process unit are vertically stacked, and an adhesion/cooling process unit (AD/COL) 30, in which an adhesion process unit and a cooling unit are vertically stacked, are provided to the other side of the transferring path 13.

In addition, the rear stage process block 2c comprises a main transferring apparatus 19, which is movable along the transferring path 14. Three developing units 24a, 24b, 24c are provided to one side of the transferring path 14, while a heating process unit 31, which is stacked as two stages vertically, and two heating/cooling process units (HP/COL) 32, 33, in which a heating process unit and a cooling process unit are vertically stacked respectively, are provided to the other end of the transferring path 14.

A chemical supply unit 34 is provided to a spinner system unit arranging side of each of the relay portions 15 and 16. A space 35 where the main transferring apparatus can be loaded and unloaded is also provided thereto.

The main transferring apparatus 17 has functions of transferring/receiving the substrate S to/from the transferring mechanism 11 of the transferring section 10, and loading/unloading the substrate S into/from the respective process units in the front stage process block 2a, and transferring/receiving the substrate S to/from the relay unit 15. The main transferring apparatus 18 has functions of transferring/receiving the substrate S to/from the relay unit 15, and loading/unloading the substrate S into/from the respective process units in the intermediate stage process block 2b, and transferring/unloading the substrate S to/from the relay unit 16. The main transferring apparatus 19 has functions of transferring/receiving the substrate S to/from the relay unit 16, and loading/unloading the substrate S into/from the respective process units in the rear stage process block 2c, and transferring/unloading the substrate S to/from the interface portion 3. Note that the relays 15 and 16 can function as a cooling plate, respectively.

The interface portion 3 comprises an extension 36 for holding the substrate temporarily when the substrate is carried/received to/from the processing section 2, two buffer stages 37 which are provided on both sides of the extension 36 and in which buffer cassettes are arranged, and a transferring mechanism 38 for transferring the substrate S between two buffer stages 37 and an exposure unit 40. The transferring mechanism 38 includes a transferring arm 39 which is movable on transferring paths 38a provided along the alignment direction of the extension 36 and the buffer stages 37. The substrate S can be carried between the processing section 2 and the exposure unit 40 by the transferring arm 39.

Thus, the respective process units are combined, so that a space saving and improvement in the efficiency of the process can be achieved.

Figure 2:
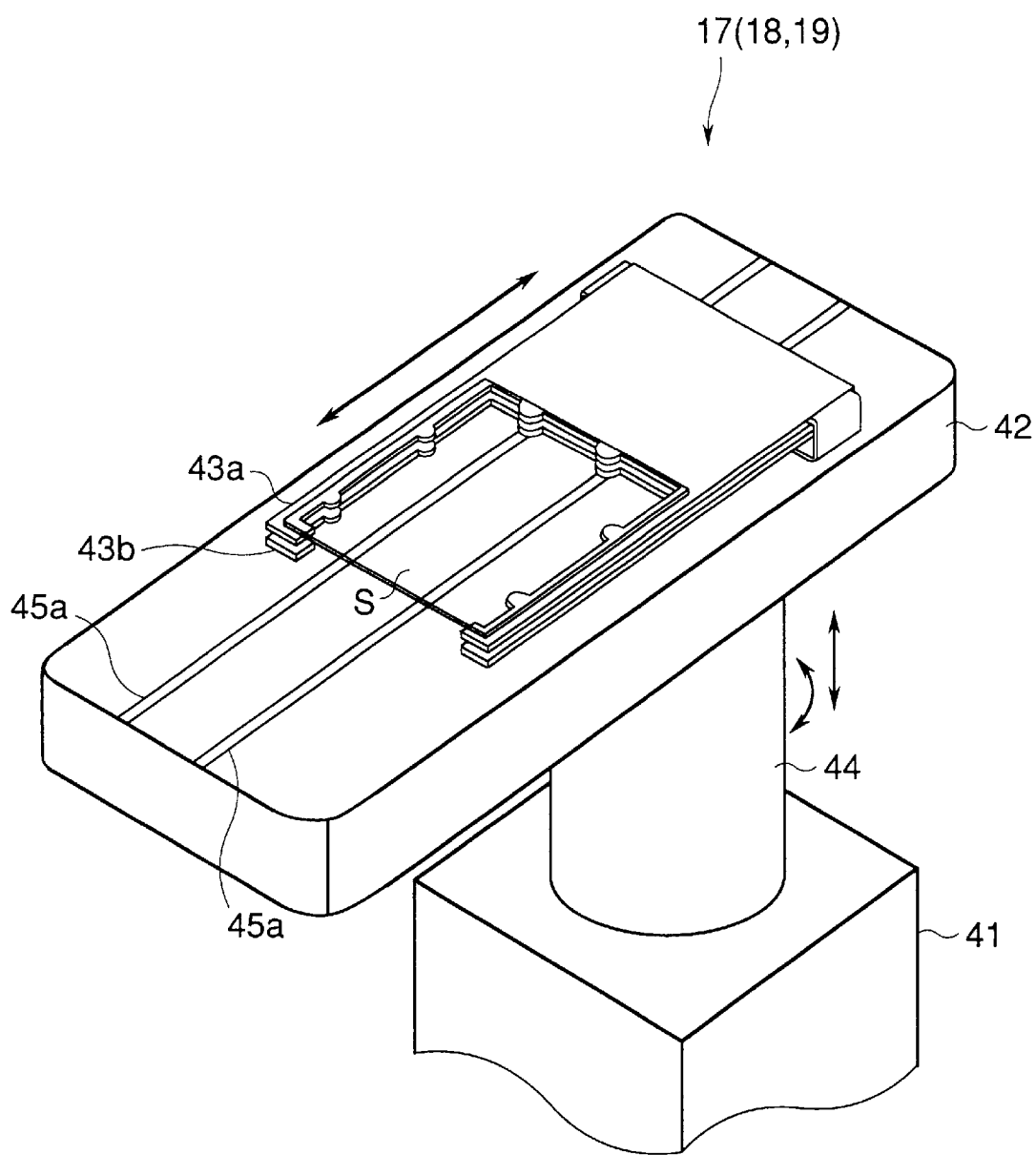
FIG. 2 is a perspective view showing a transferring mechanism used in a processing section of the processing system of FIG. 1.

As shown in FIG. 2, the main transferring apparatus 17 comprises a main body 41, which is movable along the transferring path 12, a base member 42, which can move up and down to the main body 41 and which can rotate thereto, and two substrate support members 43a, 43b, which can independently move on the base member 42 along a horizontal direction. A central portion of the base member 42 and the main body 41 are coupled to each other by a coupling portion 44. The coupling portion 44 is moved up and down or rotated by a motor (not shown) built in the main body 41, thereby the base member 42 is moved up and down or rotated. The substrate S is carried by the above up and down movement of the base member 42, its rotation, and horizontal movement of the substrate support members 43a and 43b. Reference numerals 45a and 45b denote guide rails for guiding the substrate support members 43a and 43b, respectively. Note that the main transferring apparatuses 18 and 19 are structured in the same manner as the main transferring apparatus 17.

Next, an etching process unit 25 will be explained.

Figure 3:
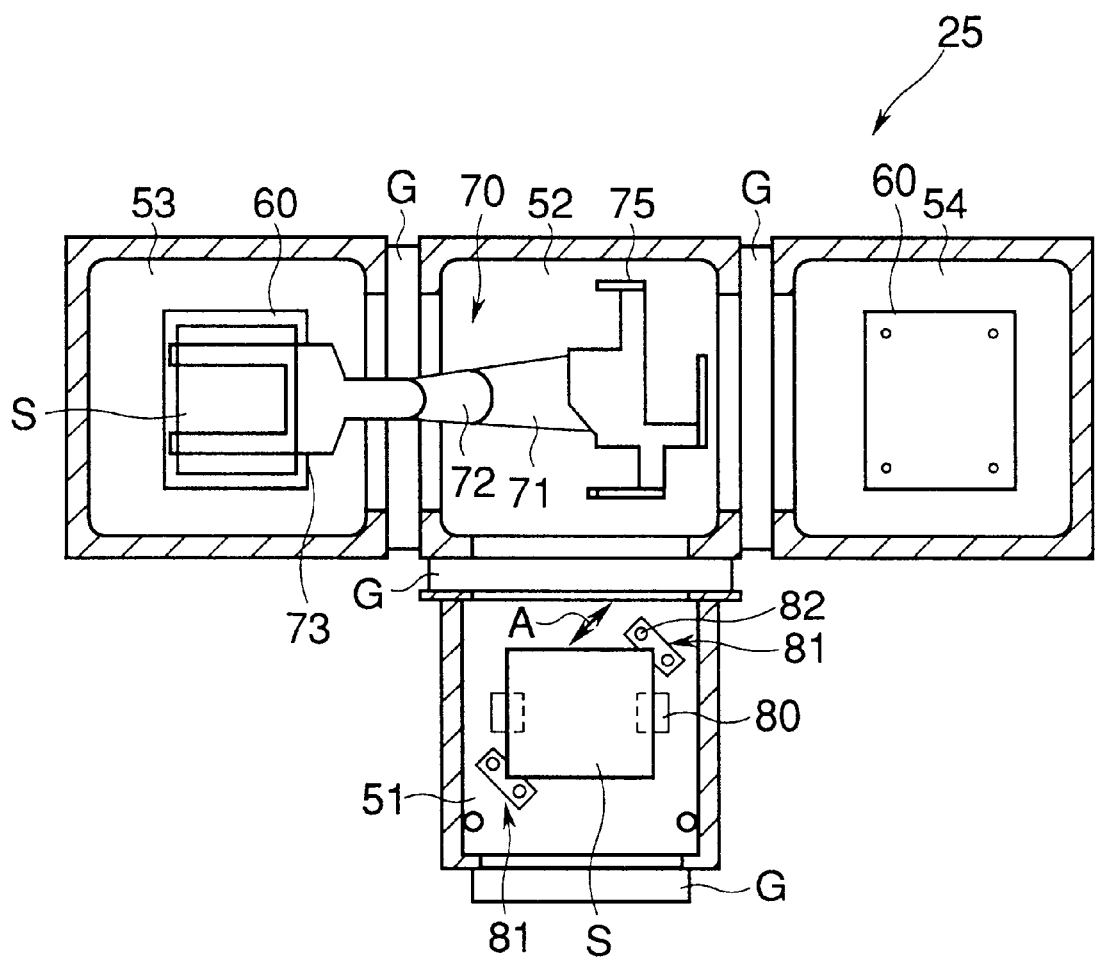
FIG. 3 is a horizontal cross-sectional view showing an etching process unit of the processing system of FIG. 1.

FIG. 3 is a horizontal cross-sectional view showing the etching process unit 25. The etching process unit 25 is structured such that an etching process and an ashing process can be applied to the substrate S in a vacuum state. The etching process unit 25 comprises a load lock chamber 51, a transferring chamber 52, an etching process chamber 53, and an ashing process chamber 54. The load lock chamber 51 is provided face to the transferring path 12. The transferring chamber 52 is provided to the back of the transferring chamber 51. The etching process chamber 53 is provided to one side of the transferring chamber 52. The ashing process chamber 54 is provided to the other side of the transferring chamber 52. Gate valves G are provided between the load lock chamber 51 and the transferring chamber 52 and between the transferring chamber 52 and the respective process chambers, respectively. The gate valves G are structured to seal airtightly the portions between these chambers and to be openable and closeable. The gate valve G is also provided to an opening portion for communicating the load lock chamber 51 with atmosphere of the outer portion.

Each of the etching process chamber 53 and the ashing process chamber 54 has a stage 60 for loading the substrate S therein, respectively, such that the interior of the stage 60 can be vacuumized and exhausted. Then, a predetermined etching gas is introduced into the etching process chamber 53, and a high frequency electrical field can be applied thereto. Thereby, plasma is formed, and a predetermined film of the substrate S is etched in accordance with its developing pattern by plasma. On the other hand, ashing gas, for example ozone, can be introduced into the ashing process chamber 54, and resist after the etching process can be removed by ashing gas.

The transferring chamber 52 is also structured such that its interior can be vacuumized and exhausted, and a substrate transferring member 70 is provided therein. The substrate transferring member 70 is of a multi-joint arm type, and comprises a base 71, an intermediate arm 72, and a substrate support arm 73 provided at its tip portion. The connecting portion of these members is rotatable. The substrate transferring member 70 transfers/receives the substrate S to/from the load lock chamber 51, the etching process chamber 53, and the ashing chamber 54. A buffer frame member 75 is provided at an opposite side to the intermediate arm 72 of the base 71 of the substrate transferring member 70. The buffer frame member 75 is structured such that the substrate S can be held, thereby holding the substrate S contemporarily to improve throughput. The load lock chamber 51 is also structured such that its interior can be vacuumized and exhausted, and racks 80 for loading the substrate S and positioners 81 for aligning the substrate S are provided therein. The positioners 81 move along a direction of an arrow A, two corner portions of the substrate S, which are opposite to each other, are pressed by two rollers 82, so that the substrate S is aligned on the rack 80. In order to confirm the end of the alignment, an optical sensor (not shown) is used. For transferring/receiving the substrate S to/from a substrate transferring mechanism 17, the interior of the load lock chamber 51 is set to atmosphere. For transferring the substrate into the process chamber 53 or 54, the interior thereof is set to vacuum atmosphere.

Figure 4:
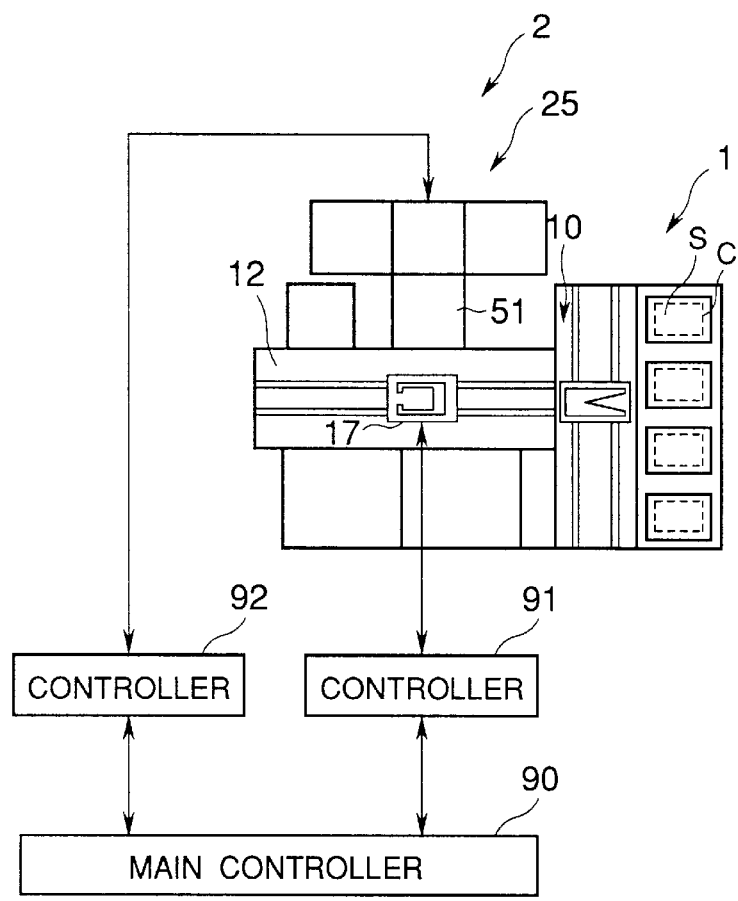
FIG. 4 is a view showing a control system of a main transferring apparatus and an etching unit of the processing system of FIG. 1.

In such a processing system, since a series of processes for resist coating/developing and the process in the etching process unit 25 are carried out in accordance with each recipe, time lag occurs between processing time for resist coating/developing and processing time for etching and ashing. If the main transferring apparatus 17 is left as it is, stand-by time of the main transferring apparatus 17 is increased, thereby lowering throughput. To deal with this problem, according to this embodiment, for example, in a case where the main transferring apparatus 17 is not allowed to transfer the substrate S to the etching process unit 25 due to the time lag between processing time for resist coating/developing and processing time for etching and ashing, the main transferring apparatus 17 is controlled to transfer the substrate S to a buffer which temporarily holds the substrate. More specifically, as shown in FIG. 4, a main controller 90, a controller 91 of the main transferring apparatus 17, and a controller 92 of the etching process unit 25 are used. Based on information of the controllers 91 and 92, a command for transferring the substrate S to the buffer is issued to the controller 91 from main controller 90 when it is needed that the substrate S be waited. In this case, the cassette C of the cassette station 1 can be used as a buffer.

Figures 5A, 5B:
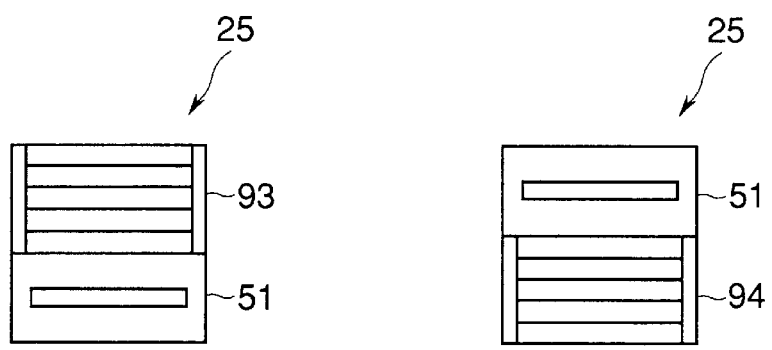
FIGS. 5A and 5B are front views each showing an arrangement of a buffer cassette in the processing system of FIG. 1.

Also, as a buffer for temporarily holding the substrate, there may be provided a buffer cassette 93 on the load lock chamber 51 of the etching process unit 25, as shown in FIG. 5A. Or, a buffer cassette 94 may be provided under the load lock chamber 51, as shown in FIG. 5B.

Next, the following will explain a processing operation of the substrate S in the above-structured processing system.

First of all, the substrate S contained in the cassette C is carried into the front stage process block 2a of the processing section 2. Then, the substrate S is subjected to scrubber cleaning process in cleaning units (SCR) 21a, 21b, and heated and dried in the heating process unit (HP) of the heating/cooling process unit (HP/COL) 26. Then, the substrate S is cooled in the cooling unit (COL).

Thereafter, the substrate S is carried into the intermediate process block 2b. Then, in order to enhance a fixing property of the resist, the substrate is subjected to hydrophobicity process (HMDS process) in the upper stage adhesion process unit (AD) of the unit 30, and cooled in the cooling unit (COL). Thereafter, the substrate is coated with the resist in the resist coating unit (CT) 22. Then, an extra resist on the peripheral portion of the substrate S is removed by the edge remover (ER) 23. Then, the substrate S is subjected to pre-bake process in the heating process unit (HP) in the intermediate stage process block 2b, and then is cooled in the lower stage cooling unit (COL) in the units 28, 29, and 30.

Thereafter, the substrate S is carried by the main transferring apparatus 19 from the relay portion 16 to the exposure unit 40 via the interface portion 3, and then predetermined patterns are exposed on the substrate S. Then, the substrate S is carried again via the interface portion 3 and developed in any of the developing process units (DEV) of the rear stage process block 2c so as to form predetermined circuit patterns. The developed substrate S is subjected to post-bake process in any of the heating process units (HP) of the rear stage process block 2c, and is cooled in the cooling unit (COL), and then is transferred into the relay portion 15 by the main transferring apparatuses 19, 18. Thereafter, the substrate S is transferred in the load lock chamber 51 in the etching unit 25 of the front stage process block 2a by the main transferring apparatus 17. At this time, the load lock chamber 51 is set to atmosphere, and the gate valve G between the load lock chamber 51 and the transferring chamber 52 is closed.

In the load lock chamber 51, the substrate S on the rack 80 is aligned by the positioner 81. Thereafter, the interior of the load lock chamber 51 is vacuumized and exhausted in a state in which the gate valve G on both sides of the load lock chamber 51 is closed. Then, the gate valve G on the side of the transferring chamber 52 is opened at the time when pressure reaches a predetermined value. At this time, the transferring chamber 52, the etching process chamber 53, and the ashing process chamber 54 are vacuumized and exhausted to a predetermined degree of vacuum.

Sequentially, the substrate S on the rack 80 of the load lock chamber 51 is received by the substrate transferring member 70 of the transferring chamber 52. Then, the gate valve G between the transferring chamber 52 and the etching process chamber 53 is opened so as to transfer the substrate S into the etching process chamber 53. After this, the gate valve G is closed, and the substrate S is subjected to etching process in the etching process chamber 53.

After the end of the etching process, the gate valve G is opened, and the substrate S is carried from the etching process chamber 53 by the substrate transferring member 70. Then, the gate valve G between the transferring chamber 52 and the ashing process chamber 54 is opened so as to transfer the substrate S into the etching process chamber 53. After this, the gate valve G is closed, and the substrate S is subjected to ashing process in the ashing process chamber 54.

Note that the substrate S carried into the etching process unit 25 may be once held in the buffer frame member 75 so as to take up the substrate S from the buffer frame member 75, depending on the sequence.

The substrate S, which has been thus subjected to the ashing process, is returned to the load lock chamber 51 from the ashing process chamber 54 by the transferring member 70, and the load lock chamber 51 is returned to atmosphere. Thereafter, the substrate S is taken up from the main transferring apparatus 17. Then, the substrate S is carried to the scrubber cleaning unit (SCR) 21a or 21b, and is subjected to the cleaning process therein.

The substrate S in which a series of processes is finished is delivered to the transferring mechanism 11 of the transferring section 10 by the main transferring apparatus 17, and is carried into the cassette C for a processed substrate.

The above-mentioned processes are repeated by the number of times corresponding to the number of substrates S in one cassette C and the processing of the substrates in one cassette is finished.

According to this embodiment, unlike the conventional case, the respective units of the resist coating/developing process, the etching process, and the later cleaning process are not separated to arrange each unit intensively. In other words, a plurality of process units for applying a series of processes including a resist coating and developing after exposing, and an etching to the substrate after developing are integrally provided. As a result, the resist coating/developing process and the etching process can be performed at one time by one apparatus, the transferring distance of the substrate in a series of processes can be considerably shortened, and an extremely high efficient processing can be realized. Since each process unit is provided on both sides of the transfer path, transferring efficiency is good. The transferring paths 12, 13, 14 are linearly provided, so that unit arranging efficiency becomes good, and the transferring efficiency can be further improved. Since the cassette station 1, serving as a transferring in/out portion, is continuously provided to the processing section 2, the substrate S can be continuously transferred to the processing section 2, so that extremely high efficiency can be obtained.

Figure 6:
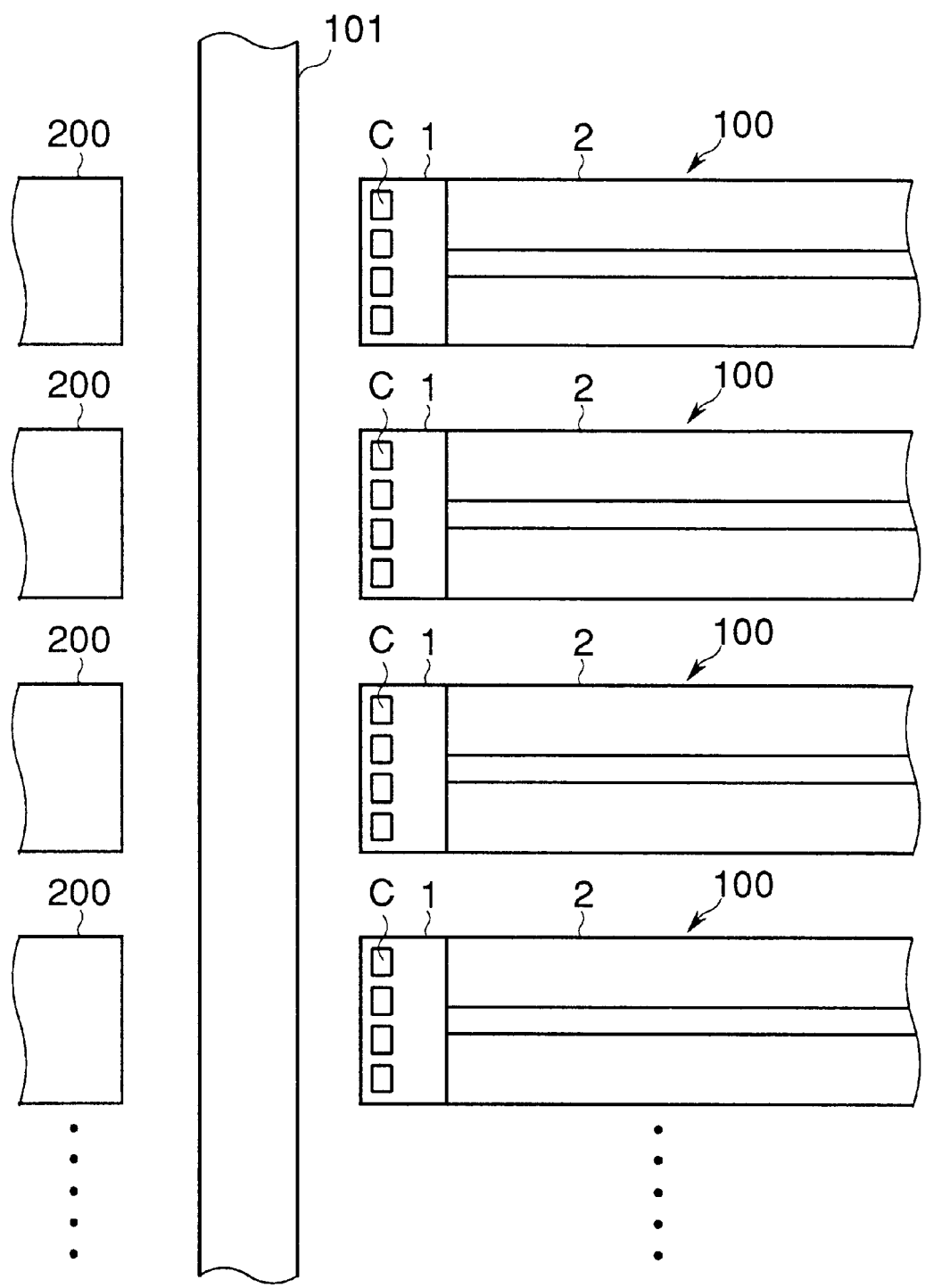
FIG. 6 is a schematic view showing a favorable arrangement of the processing system of FIG. 1.

Particularly, as shown in FIG. 6, a plurality of process systems 100 of this embodiment are arranged in parallel such that the cassette station, serving as the loading/unloading portion, faces an AGV line 101. Then, a plurality of film forming units 200 for forming a thin film on the substrate are provided on an opposite side to the AGV line 101. Thereby, the transferring distance of cassette C can be largely reduced, and the series of processes from the film forming to the etching can be substantially continuously carried out.

Figure 7:
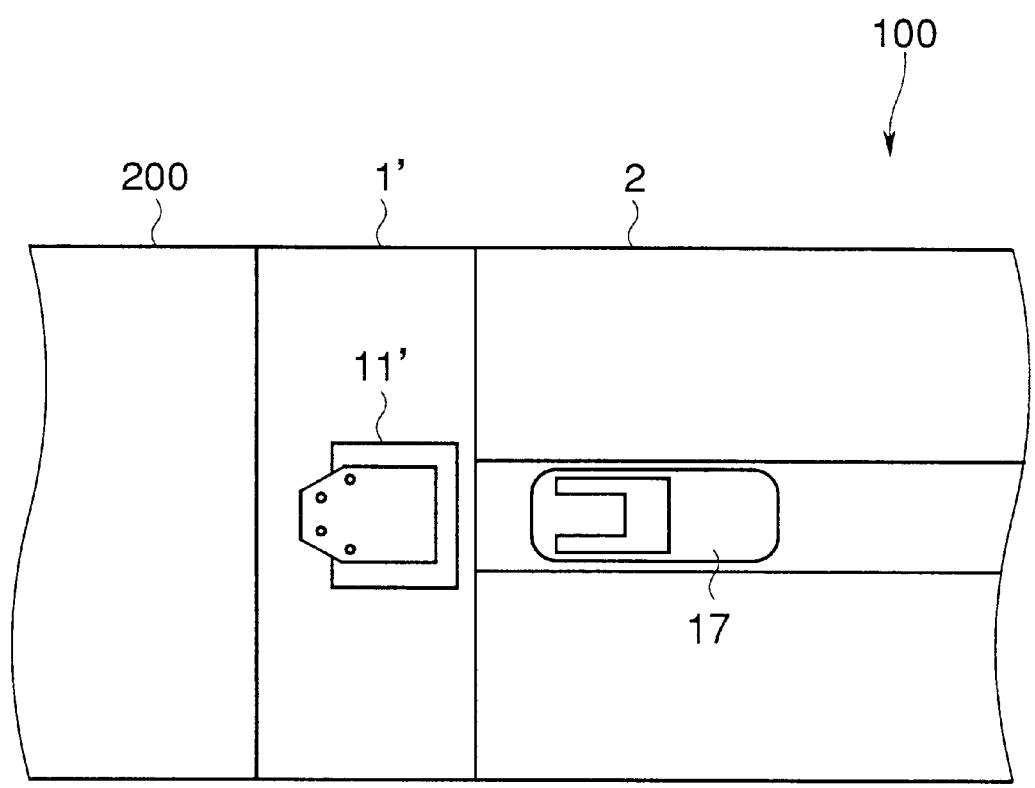
FIG. 7 is a view showing a processing system for an LCD substrate according to a modification of the first embodiment of the present invention.

As shown in FIG. 7, the loading/unloading portion, that is, the cassette station 1, is replaced with an interface portion 1', and the film forming unit 200 is connected thereto. Then, the substrate S is transferred/received between the film forming unit 200 and the processing section 2 by a transferring mechanism 11'. This makes it possible to carry out the series of processes from the film forming to the etching completely continuously.

Figure 8:
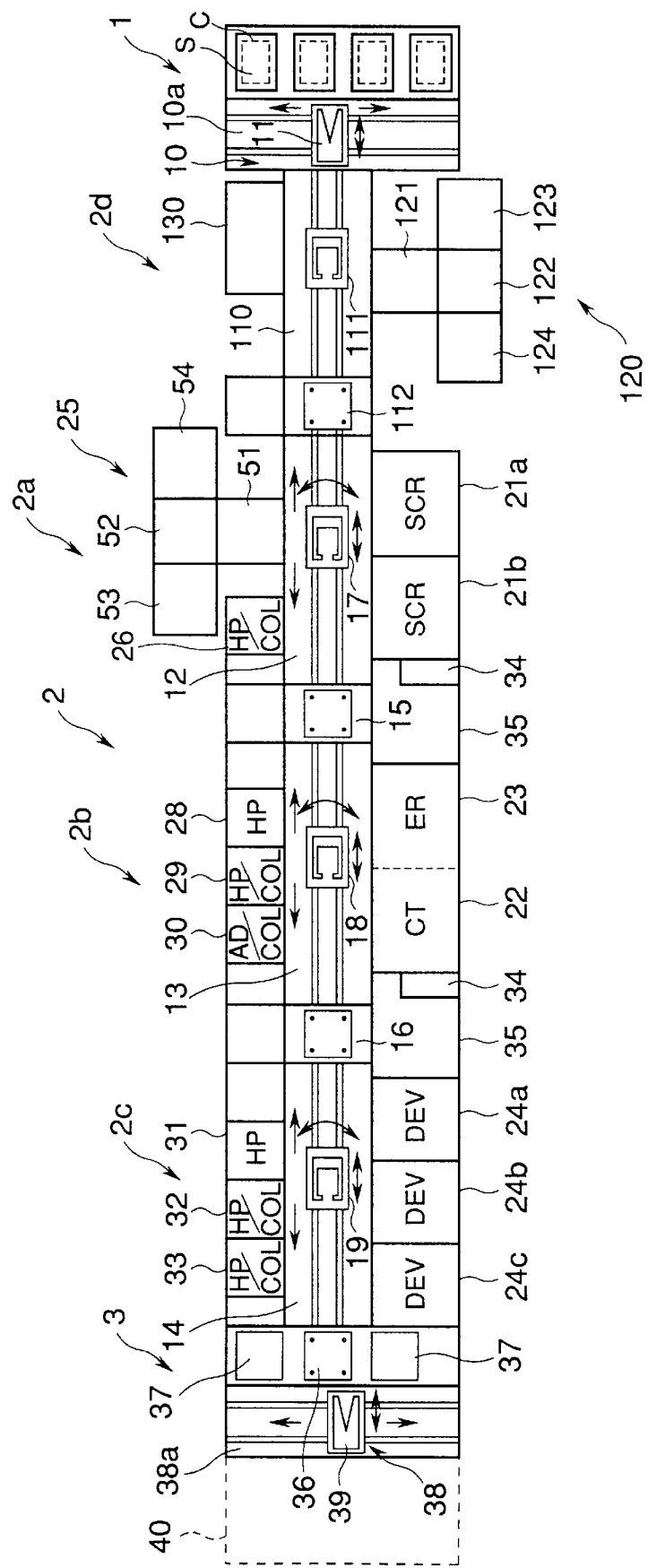
FIG. 8 is a plan view showing a processing system for an LCD substrate according to another modification of the first embodiment of the present invention.

Moreover, a film forming unit can be incorporated into the system shown in FIG. 1. One example is shown in FIG. 8. FIG. 8 shows a system in which a process block 2d for performing a film forming process is added to the front stage side of the processing section 2 of the system of FIG. 1. The process block 2d comprises a transferring path 110, and a main transferring apparatus 111 movable along the transferring path 110. A film forming process unit 120 is provided to one side of the transferring path 110, and an inspection unit 130 is provided to the other side thereof. The transferring path 110 is linearly formed to be continuous to the transferring paths 12, 13, 14, and a relay portion 112 is provided between the transferring path 12 and the transferring path 110. Note that the main transferring apparatus 111 has the same structure as the main transferring apparatuses 17, 18, and 19.

The film forming process unit 120 comprises a load lock chamber 121, which is provided to face the transferring path 110, a transferring chamber 122, which is provided to the back of the load lock chamber 121, and two film forming chambers 123 and 124, which are provided to both sides of the transferring chamber 52. The load lock chamber 121 and the transferring chamber 122 have the same structure as the load lock chamber 51 and the transferring chamber 52, respectively. Each of the film forming chambers 123 and 124 has a stage in which the substrate S is loaded, and a predetermined film is formed, for example, by CVD in vacuum atmosphere.

Note that, in this system, since the film forming process unit 120 is provided, it is preferable that not only the main transferring apparatus 17 but also the main transferring apparatus 111 are controlled in the same manner as shown in FIG. 4.

In the above-mentioned system, the substrate S in the cassette C is carried to the process block 2d of the processing section 2, and a predetermined film is formed in the film forming process unit 120. After this, a predetermined inspection is performed in the inspection unit 130, and the substrate S is carried to the process block 2a through the relay portion 112. Thereafter, the substrate S is subjected to a series of processes in the same procedure as the system of FIG. 1.

According to the above-mentioned system, a plurality of process units for applying a series of processes including a forming a thin film on a substrate S, a resist coating to the substrate S, a developing to the exposed substrate, and an etching to the developed processing substrate are integrally provided. As a result, the transferring distance of the substrate S in the series of processes can be furthermore shortened and furthermore high efficient processes can be realized.

Next, the following will explain a modification of the above-explained embodiment.

Figure 9:
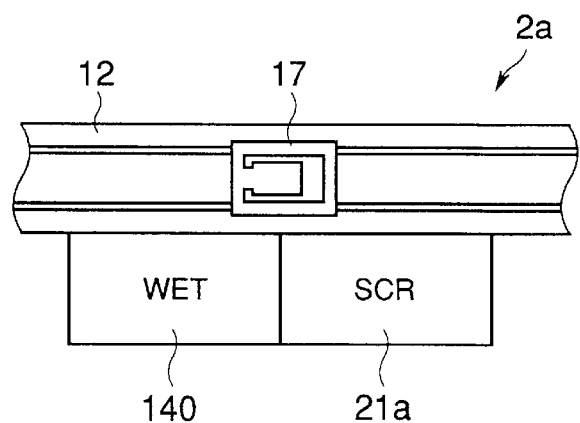
FIG. 9 is a plan view showing a part showing a part of a processing system for an LCD substrate according to further another modification of the first embodiment of the present invention.

In the above embodiment, two scrubber cleaning units 21a, 21b were provided in the process block 2a. However, when light ashing is performed in the ashing chamber 54, one scrubber cleaning unit may be replaced with a wet cleaning unit 140 as shown in FIG. 9. Then, the remains of the resist can be completely removed by the wet cleaning unit 140.

Figure 10A:
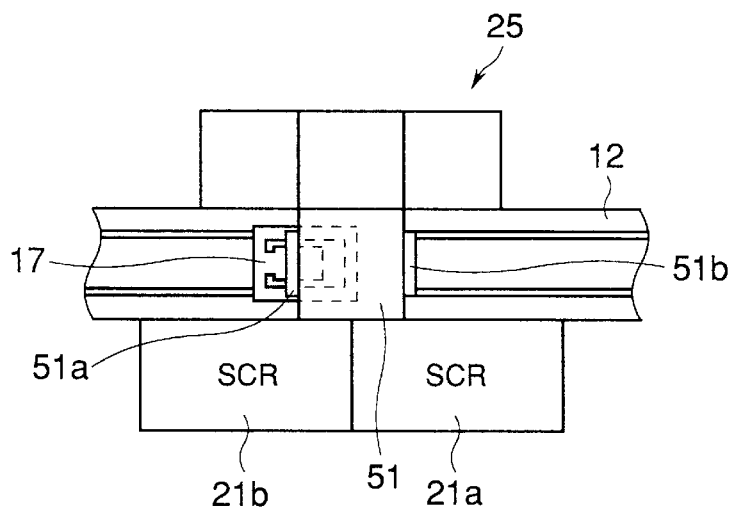
FIG. 10A is a plan view showing a part of the processing system for an LCD substrate according to further another modification of the first embodiment of the present invention.
Figure 10B:
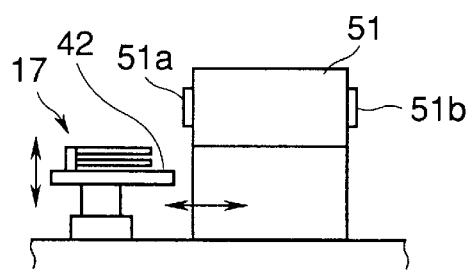
FIG. 10B is a side view of FIG. 10A.
Figure 11:
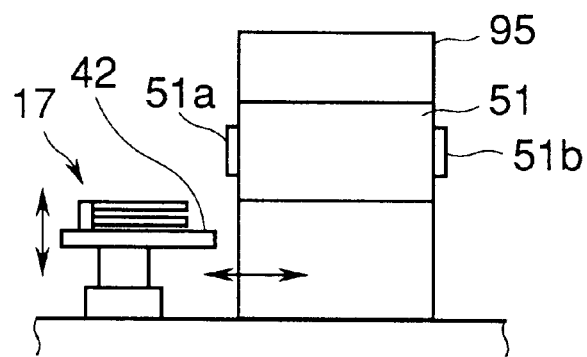
FIG. 11 is aside view showing a state in which the buffer cassette is provided on a load lock chamber shown in FIG. 10B.
Figure 12:
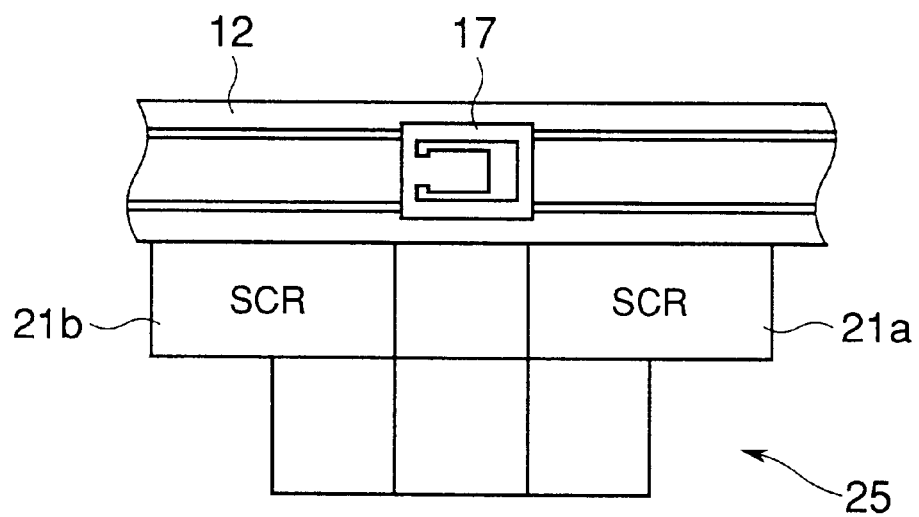
FIG. 12 is plan view showing a part of the processing system for an LCD substrate according to further another modification of the first embodiment of the present invention.

Also, as shown in FIGS. 10A and 10B, the load lock chamber 51 of the etching process unit 25 can be provided to be overlapped with the transferring path 12 so as to reduce the space. In this case, the load lock chamber 51 may be provided at the upper portion than a general pass line of the main transferring apparatus 17, and the base member 42 of the main transferring unit 17 may be moved up in transferring the substrate into the lode lock chamber 51. As shown in these figures, in this case, gate valves 51a and 51b for loading/unloading are provided on both side surfaces of the load lock chamber 51. Also, as shown in FIG. 11, there can be provided a buffer cassette 95 for temporarily holding the substrate S on the load lock chamber 51 for the above-mentioned purpose. Moreover, as shown in FIG. 12, the etching process unit 25 may be provided between two scrubber cleaning units 21a, 21b.

Second Embodiment

Next, the second embodiment will be explained.

Figure 13:
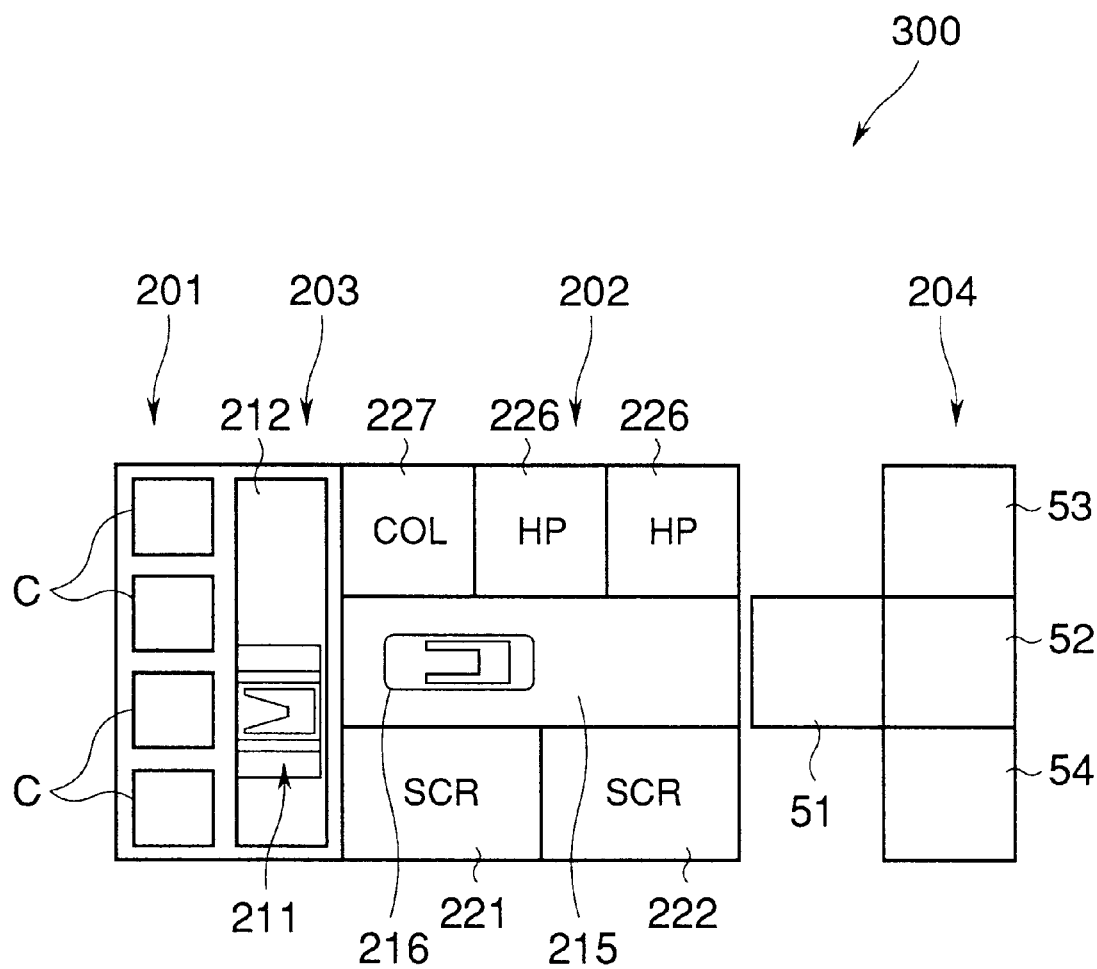
FIG. 13 is a plan view showing a processing system for an LCD substrate according to a second embodiment of the present invention.

First, there is shown a substrate process system in which the etching/ashing process and the cleaning process can be executed at one time. FIG. 13 is a plan view showing such an LCD substrate process system.

A process system 300 comprises a cassette station 201, a cleaning process portion 202, a transferring portion 203, and a vacuum process portion 204. The cassette station 201 loads the cassette C containing the plurality of LCD substrates S, and structures a loading/unloading portion. The cleaning process portion 202 comprises a plurality of process units for applying the cleaning process and the later drying process to the substrate S. The transferring portion 203 transfers the substrate S between the cassette C on the cassette station 201 and the process portion 202. The vacuum process portion 204 is provided to the end portion opposite to the cassette station 1 of the cleaning process portion 2, and carries out the etching/ashing process. Then, the cassette C is loaded/unloaded into/from the cassette station 201. The transferring portion 203 comprises a transferring mechanism 211, which is movable on a transferring path 212 provided along an alignment direction of the cassette. Then, the substrate S is transferred between the cassette C and the cleaning process portion 202 by the transferring mechanism 211.

The cleaning process portion 202 has a transferring path 215 at the central portion, and the respective process units are provided to both sides of the transferring path 215. More specifically, two scrubber cleaning units (SCR) 221, 222 are provided to one side of the transferring path 215, and a plurality of heat process units (HP) 226, and a cooling unit (COL) 227 are provided to the other side thereof. In the transferring path 215, there is provided a main transferring apparatus 216 to be movable, and the substrate S is transferred/received by the main transferring apparatus 216 as described below.

The scrubber cleaning process units (SCR) 221, 222 clean the substrate S with water using a brush. Two pairs of the heat process units (HP) 226 each of which is stacked as two stages are arranged along the transferring path 215. The cool unit (COL) 227, which is stacked as two stages, is provided to the cassette station side. The heat process units (HP) 226 dry the substrate S after cleaning. After the process in the heat process units (HP) 226, the substrate S is cooled to reduce the temperature to ordinary temperature in the cool unit (COL) 227.

The main transferring apparatus 216 has completely the same structure as the main transferring apparatus 17 of the first embodiment. Specifically, the main transferring apparatus 216 comprises the main body 41, the base member 42, which can move up and down to the main body 41 and which can rotate thereto, and two substrate support members 43a, 43b, which can independently move on the base member 42 along the horizontal direction. The main transferring apparatus 216 has functions of transferring/receiving the substrate S to/from the transferring mechanism 211 of the transferring portion 203 and loading/unloading the substrate S into/from the respective process units in the cleaning process portion 202, and transferring the substrate S to/from the vacuum process portion 204.

The vacuum process portion 204 can apply the etching process and the ashing process to the substrate S in the vacuum state. The vacuum process portion 204 has the same structure as the etching unit of the first embodiment. In other words, the vacuum process portion 204 comprises the first load lock chamber 51, which is provided to the transferring path 215, the second load lock chamber 52, which is provided to the back of the first load lock chamber 51, the etching process chamber 53, which is provided to one side of the second load lock chamber 52, and the ashing process chamber 54, which is provided to the other side of the second load lock chamber 52.

Figure 14:
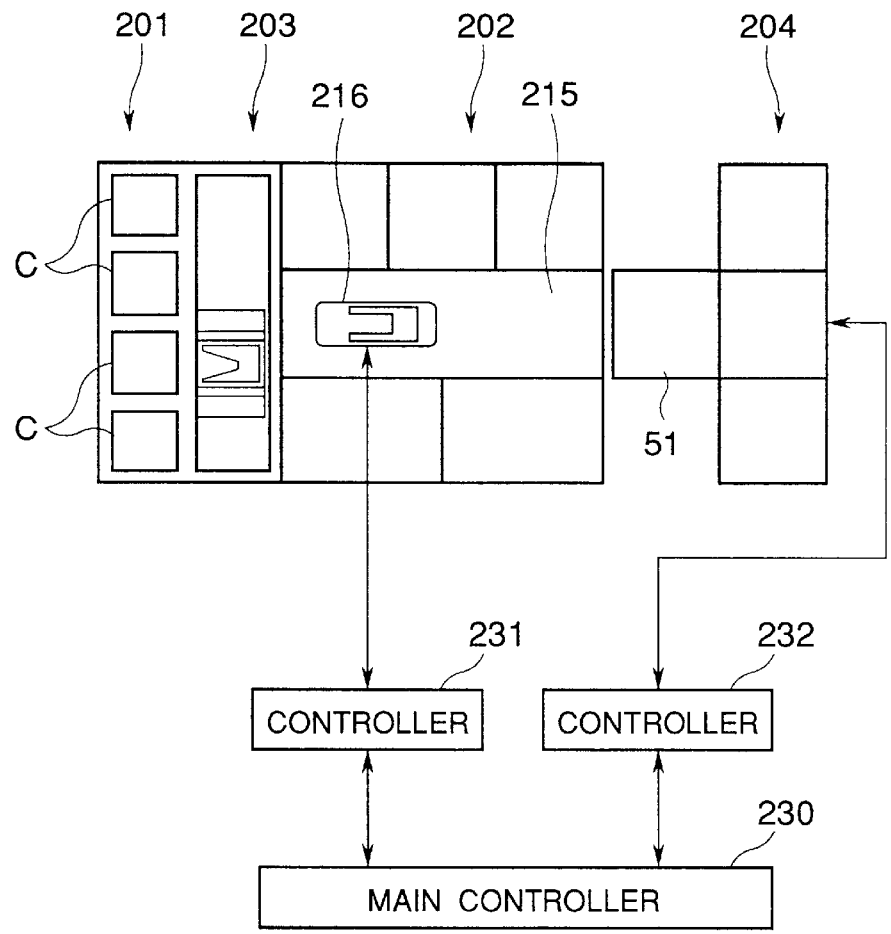
FIG. 14 is a view showing a control system of a main transferring apparatus and an etching unit of the processing system of FIG. 1.

In such a processing system, since the cleaning processes and the process in the etching process unit 204 are carried out in accordance with each recipe, time lag occurs between processing time for cleaning and processing time for etching and ashing. Therefore, also in this embodiment, if the main transferring apparatus 216 is not allowed to transfer the substrate S to the etching process unit 204 due to the time lag between processing time for cleaning and processing time for etching and ashing, the main transferring apparatus 216 is controlled to transfer the substrate to a buffer which temporarily holds the substrate. More specifically, as shown in FIG. 14, a main controller 230, a controller 231 of the main transferring apparatus 216, and a controller 232 of the etching process unit 204 are used. Based on information of the controllers 231 and 232, a command for transferring the substrate S to the buffer is issued to the controller 231 from main controller 230 when it is needed that the substrate S be waited. In this case, the cassette C of the cassette station 201 can be used as a buffer.

Figures 15A, 15B:
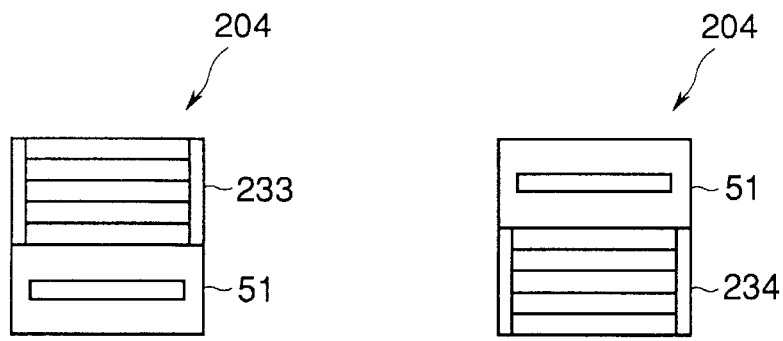
FIGS. 15A and 15B are front views each showing an arrangement of a buffer cassette in the processing system of FIG. 13.

Also, as a buffer for temporarily holding the substrate, there may be provided a buffer cassette 233 on the load lock chamber 51 of the etching process unit 204, as shown in FIG. 15A. Or, a buffer cassette 234 may be provided under the load lock chamber 51, as shown in FIG. 15B.

Next, the processing operation of the substrate S in the above-structured process system 300 will be explained.

In the cassette C, the substrate S, which has been subjected to the developing process, is contained. The substrate S in the cassette C is carried to the cleaning process portion 202. In this case, an arm of the transferring mechanism 211 of the transferring portion 203 takes up one LCD substrate S from the cassette C. The arm loads the substrate S on the base support member 43*a* or 43*b* of the main transferring apparatus 216 so as to carry the substrate S to the cleaning process portion 202.

Then, the substrate S is transferred to the predetermined process unit, and is subjected to the predetermined process. More specifically, if the cleaning is needed before the etching process, a precleaning is provided to the substrate S in the scrubber cleaning unit (SCR) 221 or 222. When such a precleaning is provided, the substrate S is dried in the heat process unit (HP) 226, and is cooled to ordinary temperature in the cool unit (COL) 227.

Thereafter, the substrate S is carried to the first load lock chamber 51 of the vacuum process portion 204 by the main transferring apparatus 216, and is subjected to the etching process and the ashing process, similar to the first embodiment. When the substrate S, which has been subjected to the ashing process, is returned to the first load lock chamber 51 from the ashing process chamber 54 through the second load lock chamber 52, the first load lock chamber 51 is returned to atmosphere. Thereafter, the substrate S is taken up by the main transferring apparatus 216. Then, the substrate S is carried to the scrubber cleaning unit (SCR) 221 or 222, and is subjected to the cleaning process after the ashing process. After the cleaning process, the substrate S is heated and dried in the heat process unit (HP) 226, and is cooled to ordinary temperature in the cool unit (COL) 227.

The above-mentioned processes are repeated by the number of times corresponding to the number of substrates S in one cassette C and the processing of the substrates in one cassette is finished.

Thus, according to this embodiment, unlike the conventional case, the vacuum process unit for applying the etching process and the ashing process to the substrate S in the vacuum state and the process unit for performing the cleaning process as a pre-process and/or a post-process are not arranged at the separated position. In other words, the vacuum process portion 204 for performing the vacuum process and the cleaning process portion having the plurality of units for performing the cleaning process and the following heat process are integrally provided. As a result, these processes can be continuously performed at one time by one apparatus and the transferring distance of the substrate in the series of processes can be greatly shortened. Therefore, extremely high efficient processes can be realized. Since the respective process units are arranged at both sides of the transferring path, the transferring efficiency is good. Moreover, since the cassette station 20, serving as a loading/unloading portion, is continuously provided to the cleaning process portion 202, the substrate S can be continuously carried to the cleaning process portion 2, and extremely high efficient process can be obtained.

Figure 16:
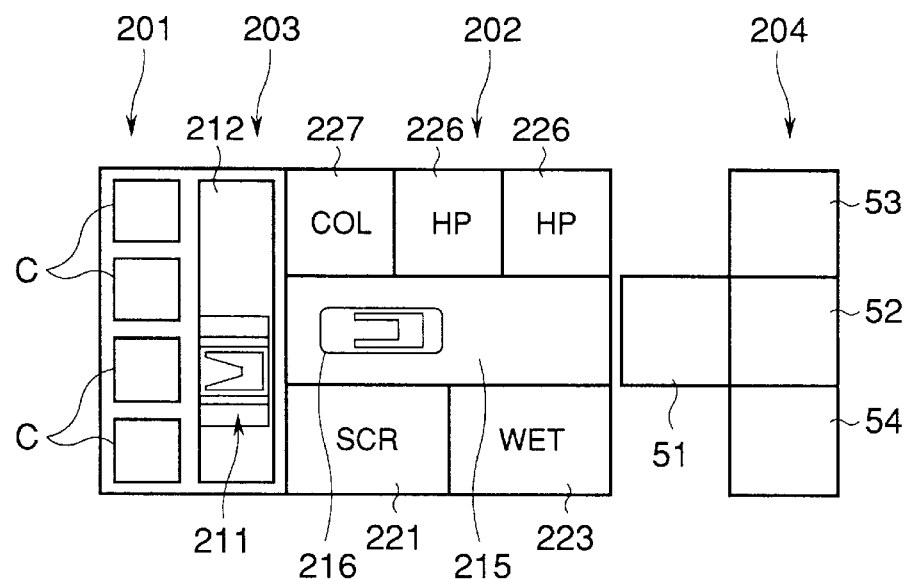
FIG. 16 is a view showing a processing system for an LCD substrate according to a modification of the second embodiment of the present invention.

Next, the following will explain a modification of the above-explained embodiment. For example, in performing light ashing in the ashing chamber 54, one scrubber cleaning unit may be replaced with a wet cleaning unit (WET) 223 as shown in FIG. 16. Then, the remains of the resist can be completely removed by the wet cleaning unit (WET) 223.

Figure 17:
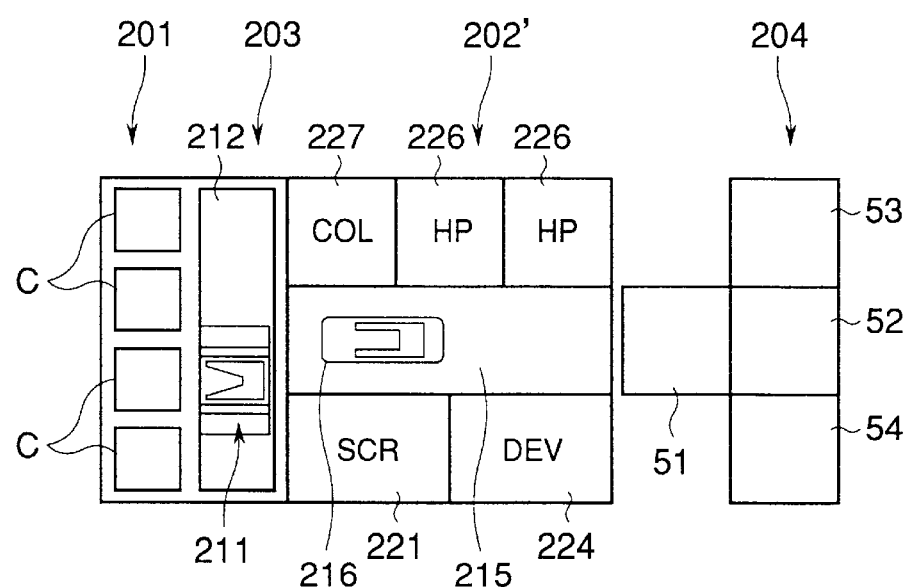
FIG. 17 is a plan view showing a processing system for an LCD substrate according to another modification of the second embodiment of the present invention.

As shown in FIG. 17, one scrubber cleaning unit (SCR) 222 may be replaced with a developing process unit (DEV) 224 so as to structure a developing/cleaning process portion 202'. In this case, the substrate S, which has been subjected to the resist coating and exposing processes, is contained in the cassette C. Then, the cleaning process is carried out in the cleaning process unit 221 as required, and heating/drying and cooling are executed in the heat process unit 226 and the cool unit 227. Thereafter, the developing process is executed in the developing unit 224, and post-baking and cooling are carried out in the heat process unit 226 and the cool unit 227. After this, in the vacuum process portion 204, similar to the above embodiment, the etching process and the ashing process are executed, and then the cleaning process is executed similarly.

Figure 18:
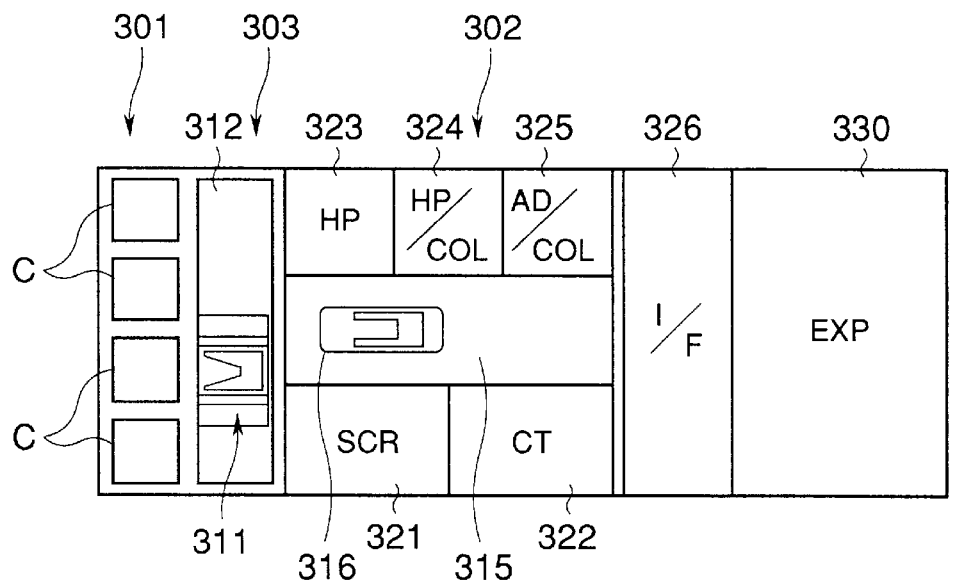
FIG. 18 is a plan view showing a system for carrying out a series of process such as resist coating and exposing, which is suitable for continuously arranging in the processing system of FIG. 17.

The system of FIG. 17 is continuously provided to the system of FIG. 18 in which a series of processes including the resist coating and exposing, etc. are executed. Thereby, the processes including the resist coating to the etching can be executed at one time.

The system of FIG. 18 comprises a cassette 301, a processing section 302 for performing the resist coating process, etc., a transferring portion 303 having a transferring mechanism 311 for transferring the substrate S between the cassette C and the cleaning process portion 302 to be movable on the transferring path 312, and an interface portion 326 for transferring/receiving the substrate S between the processing section 302 and an exposure unit (EXP) 330. The processing section 302 has a transferring path 315 at the central portion, and a scrubber cleaning unit (SCR) 321, a resist coating process unit (CT) 322 at one side. Also, the processing section 302 has a unit 323, in which the heat process unit (HP) is stacked as two stages, a heat process/cool unit (HP/COL) 324, in which the heat process unit and the cool process unit are vertically stacked, and an adhesion process/cool unit (AD/COL) 325, in which the adhesion process unit and the cool unit are vertically stacked, at the other side. The transferring path 315 has a main transferring apparatus 316, which is structured to be movable similar to the main transferring apparatus 17, 18, 19. The transferring/receiving the substrate S is executed by the main transferring apparatus 316.

In the system of FIG. 18, the substrate S in the cassette C is carried to the processing section 302 by the transferring mechanism 311. The substrate S is subjected to the scrubber cleaning in the cleaning unit (SCR) 321. Then, the substrate S is heated and dried in any of the heat process units (HP), and is cooled in the cool unit (COL). Thereafter, in order to enhance a fixing property of the resist, the substrate S is subjected to hydrophobicity process (HMDS process) in the upper stage adhesion process unit (AD) of the unit 325, and is cooled in the cooling unit (COL). Then, the substrate S is coated with the resist in the resist coating unit (CT) 322. After this, the substrate S is subjected to the pre-bake process in any of the heat process units (HP) and is cooled. Then, the substrate S is subjected to the exposure process in the exposure unit (EXP) 330 through the interface 326. The substrate S is returned to the processing section 302 through the interface 326 again. Then, the substrate S is subjected to post-exposure/bake process in the heat process unit (HP) as required, and is cooled. Thereafter, the substrate S is returned to the cassette C of the cassette station 301 through the transferring portion 303. The cassette C containing the above-processed substrate S is loaded into the cassette station 1 of the unit of FIG. 12, and the above-explained developing process and etching process are carried out.

Figure 19:
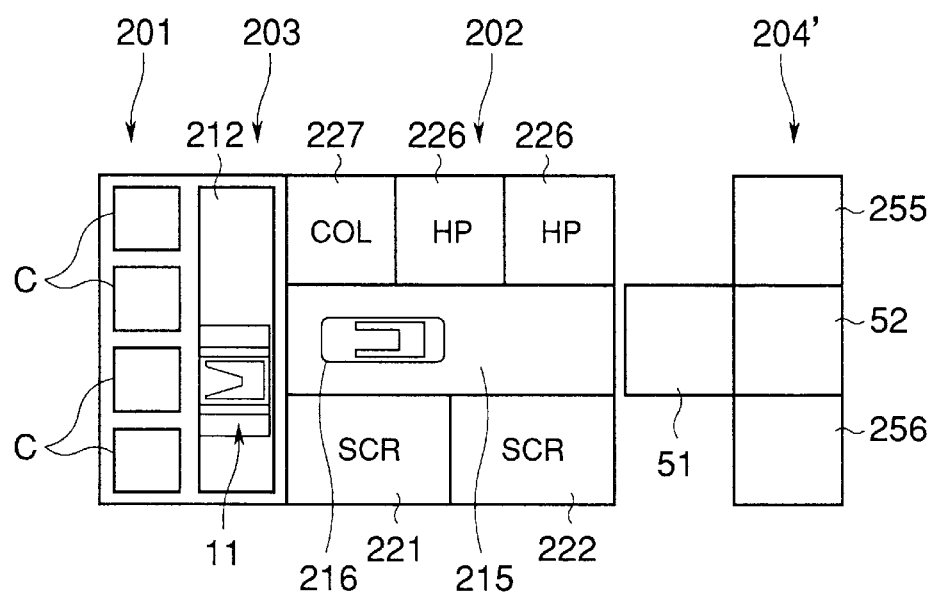
FIG. 19 is a plan view showing a processing system for an LCD substrate according to further another modification of the second embodiment of the present invention.

Moreover, as shown in FIG. 19, the etching process chamber 53 and the ashing process chamber 54 of the vacuum process portion 204 of FIG. 10 may be replaced with film forming chambers 255 and 256 so as to structure a vacuum process portion 204'. Then, the film forming process in a predetermined thin film is formed on the substrate S by CVD or PVD and the cleaning process may be executed at one time.

The system of FIG. 19, the system of FIG. 18, and the system of FIG. 17 are continuously provided, so that the film forming process, the resist/coating process, the exposure process, the developing process, and the etching process can be carried out at one time.

According to the present invention, various modifications can be made without limiting the above-mentioned embodiments. For example, the arrangement of the respective process units is not limited to the above-explained embodiments, and various arrangements can be adopted. Also, the form of the loading/unloading portion is not limited to the above-mentioned embodiments. In the first embodiment, the processing section was divided into a plurality of blocks to have relay portions between the respective blocks. However, the transferring mechanism may be structured to move on one transferring path without providing the relay portion. Also, the transferring path is not always linearly formed. Instead, the transferring path may be curved.

The above embodiments explained the case in which the LCD substrate was used as a substrate. It is needless to say that the present invention can be applied to the case in which the substrate such as a semiconductor wafer, etc., is processed.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing apparatus for processing a large-sized substrate by a photolithography process, comprising:

a first module including at least one liquid treatment unit for applying a liquid treatment to a substrate under an atmospheric pressure and at least one heat treatment unit for applying a heat treatment to the substrate under the atmospheric pressure;

a second module including at least one surface treatment unit for treating a surface of the substrate under a reduced pressure, said second module being arranged near the first module, and said first module and said second module being arranged integrally, a substrate transfer mechanism for transferring the substrate to the liquid treatment unit, the heat treatment unit, and the surface treatment unit, respectively;

a linear transfer path on both sides of which the liquid treatment unit, the heat treatment unit, and the surface treatment unit are substantially linearly arranged, and on which the substrate transfer mechanism is movably mounted for the substrate to be put into and taken out from the liquid treatment unit, the heat treatment unit, and the surface treatment unit, respectively; and a cassette portion provided on at least one side of said linear transfer path for a plurality of cassettes to be put into and taken out from, wherein said substrate transfer mechanism moving on the linear transfer path between the first and the second modules in short time, and transferring the substrate between the first and the second modules quickly.

2. A substrate processing apparatus according to claim 1, further comprising:

a buffer for temporarily storing the substrate;

a control means for controlling the substrate transfer mechanism to transfer the substrate into the buffer, when a time lag occurs between the liquid treatment unit, the heat treatment unit, and the surface treatment unit, when a time lag occurs between the liquid treatment units, when a time lag occurs between the heat treatment units, or when a time lag occurs between the surface treatment units.

3. A substrate processing apparatus according to claim 1, wherein said first module includes a coating unit for applying a resist on the substrate, and a developing unit for developing a resist coating film on the substrate, said second module includes an etching unit for etching the resist coating film or the substrate, an ashing unit for ashing the resist coating film, and a light ashing unit for ashing the resist coating film lightly, and said coating unit, said developing unit, and said etching unit are provided as one unit.

4. A substrate processing apparatus according to claim 1, wherein said cassette portion has a transferring/receiving mechanism for delivering the substrate to the substrate transfer mechanism, and said cassette portion and said linear transfer path are provided as one unit.

5. A substrate processing apparatus for processing a large-sized substrate by a photolithography process, comprising:

a first module including at least one coating unit for applying a resist to a substrate under an atmospheric pressure, and a developing unit for developing a resist coating film under an atmospheric pressure;

a second module including a film-forming unit for forming a thin film on the substrate under a reduced pressure, and an etching unit for etching the thin film or the resist coating film, the second module being arranged near the first module, and the second module, and said first module, and said second module being arranged integrally;

a substrate transfer mechanism for transferring the substrate to the coating unit, the developing unit, the film-forming unit, and the etching unit, respectively;

a linear transfer path on both sides of which the coating unit, the developing unit, the film-forming unit, and the etching unit are substantially linearly arranged, and on which the substrate transfer mechanism is movably provided for the substrate to be put into and taken out from the coating unit, the developing unit, the film-forming unit, and the etching unit, respectively; and a cassette portion provided on at least one side of the linear transfer path for a plurality of cassettes to be put into and taken out from, wherein said substrate transfer mechanism moving on the linear transfer path between the first and the second modules in a short time, and transferring the substrate between the first and the second modules quickly.

6. A substrate processing apparatus according to claim 5, further comprising:

a buffer for temporarily storing the substrate; and a control means for controlling the substrate transfer mechanism to transfer the substrate to the buffer, when a time lag occurs between the coating unit, the developing unit, the film-forming unit, and the etching unit, when a time lag occurs between the coating units, when a time lag occurs between the developing units, when a time lag occurs between the film-forming units, or when a time lag occurs between the etching units.

7. A substrate processing apparatus according to claim 5, wherein said cassette portion has a transferring/receiving mechanism for delivering the substrate to the substrate transfer mechanism, and said cassette portion and said linear transfer path are provided as one unit.

8. A substrate processing apparatus for processing a large-sized substrate by photolithography, comprising:

a first processing block having a cleaning unit for cleaning a substrate and an etching unit for applying an etching treatment to said substrate;

a second processing block having a coating unit for coating the substrate with a resist and a second heat treatment unit for applying a first heat treatment to the substrate;

a third processing block having a developing unit for developing the resist coating after selective light exposure and a second heat treatment unit for applying a second heat treatment to the substrate, said third processing block, and said first and second processing blocks being arranged integrally;

a substrate transfer mechanism for transferring the substrate into and out of the cleaning unit, the etching unit, the coating unit, the first heat treatment unit, the development unit, and the second heat treatment unit, respectively;

a linear transfer path on both sides of which the cleaning unit, the etching unit, the coating unit, the first heat treatment unit, the developing unit, and the second heat treatment unit are substantially linearly arranged, and on which the substrate transfer mechanism is movably mounted for the substrate to be put into and taken out from the cleaning unit, the etching unit, the coating unit, the first heat treatment unit, the development unit, and the second heat treatment unit, respectively; and a cassette portion arranged on at least one side of the linear transfer path for a plurality of cassettes to be put into and taken out from, wherein said substrate transfer mechanism moving on the linear transfer path between the first, the second, and the third processing blocks in a short time, for transferring the substrate between the first, the second, and the third processing blocks quickly.

9. The apparatus according to claim 8, wherein said first process block further comprises a unit for performing an ashing process after etching.

10. The apparatus according to claim 8, wherein said first process block further comprises a unit for performing a light ashing process after etching, and a unit for performing a wet cleaning after light ashing.

11. The apparatus according to claim 8, wherein said etching process unit has a process chamber for carrying out etching process in a vacuum atmosphere and a load lock chamber.

12. The apparatus according to claim 11, wherein said load lock chamber is provided at an upper portion of said first carrying path, and has gate valves for loading/unloading the substrate along the carrying path on both side surfaces thereof.

13. The apparatus according to claim 8, wherein said first transferring path, second transferring path, and third transferring path are linearly provided.

14. A substrate processing apparatus for processing a large-sized substrate by a photolithography process, comprising:

a first processing block having a film-forming unit for forming a thin film on at least a substrate;

a second processing block having a cleaning unit for cleaning said substrate and an etching unit for applying an etching treatment to said substrate;

a third processing block having a coating unit for coating the substrate with a resist and a first heat treatment unit for applying a first heat treatment to the substrate;

a fourth processing block having a developing unit for developing the resist coating after selective light exposure and a second heat treatment unit for applying a second heat treatment to the substrate, said first, second, third, and fourth processing blocks being arranged integrally;

a substrate transfer mechanism for transferring the substrate into and out of the cleaning unit, the etching unit, the coating unit, the first heat treatment unit, the development unit, and the second treatment unit, respectively;

a linear transfer path on both sides of which the cleaning unit, the etching unit, the coating unit, the first heat treatment unit, the developing unit, and the second heat treatment unit are substantially linearly arranged, and on which the substrate transfer mechanism is movably mounted for substrate to be put into and taken out from the cleaning unit, the etching unit, the costing unit, the first treatment unit, the development unit, and the second heat treatment unit, respectively; and a cassette portion arranged on at least one side of the linear transfer path for a plurality of cassettes to be put into and taken out from, wherein said substrate transfer mechanism moving on the linear transfer path between the first, the second, the third, and fourth processing blocks in a short time, for transferring the substrate between the first, the second, the third, and fourth processing blocks quickly.

15. The apparatus according to claim 14, wherein said second process block further comprises a unit for performing an ashing process after etching.

16. The apparatus according to claim 14, wherein said second process block further comprises a unit for performing a light ashing process after etching, and a unit for performing a wet cleaning after light ashing.

17. The apparatus according to claim 14, wherein said etching process unit has a process chamber for carrying out etching process in a vacuum atmosphere and a load lock chamber.

18. The apparatus according to claim 17, wherein said load lock chamber is provided at an upper portion of said first carrying path, and has gate valves for loading/unloading the substrate along the carrying path on both side surfaces thereof.

19. The apparatus according to claim 14, wherein said first transferring path, second transferring path, third transferring path, and fourth transferring path are linearly provided.

20. A substrate processing apparatus for processing a large-sized substrate by a photolithography process, comprising:

a first process section for applying a vacuum treatment to a substrate;

a second process section having a plurality of processing units for performing processing corresponding to at least one of the pretreatment and after-treatment of the vacuum treatment applied by said first process section, said plurality of processing units of second section being provided as one unit, and the first process section and the second process section being arranged integrally;

a substrate transfer mechanism for transferring/receiving the substrate between the second process section and the plurality of processing units, and between the first process section and the second process section, respectively:

a linear transfer path on both sides of which the first process section, the second process section, and the plurality of processing units are substantially linearly arranged, and on which the substrate transfer mechanism is movably mounted for the substrate to be put into and taken out from the first process section, the second process section, and the plurality of processing units, respectively; and a cassette portion provided on at least one side of the linear transfer path for a plurality of cassettes to be put into and taken out from, wherein said substrate transfer mechanism moving on the linear transfer path between the first and the second process sections in a short time, for transferring the substrate between the first and second process sections quickly.

21. The apparatus according to claim 20, wherein said first processing section comprises at least one vacuum process chamber for performing a vacuum process, and at least one load lock chamber provided between said transferring mechanism and said vacuum process chamber.

22. The apparatus according to claim 20, wherein said first processing section comprises an etching process unit, and said second processing section comprises a cleaning process unit.

23. The apparatus according to claim 22, wherein said first processing section further comprises a unit for performing an ashing process after etching.

24. The apparatus according to claim 22, wherein said first processing section further comprises a unit for performing a light ashing process after etching, and said second processing section further comprises a unit for performing a wet cleaning after light ashing.

25. The apparatus according to claim 20, wherein said first processing section comprises an etching process unit, and said second processing section comprises a developing process unit for performing a developing process after a resist film exposure.

26. The apparatus according to claim 25, wherein said second processing section further comprises a cleaning process unit.

27. The apparatus according to claim 26, wherein said first processing section further comprises a unit for performing an ashing process after etching.

28. The apparatus according to claim 26, wherein said first processing section further comprises a unit for performing a light ashing process after etching, and said second processing section further comprises a unit for performing a wet cleaning after light ashing.

29. The apparatus according to claim 20, wherein said first processing section comprises a film forming process unit, and said second processing section comprises a cleaning process unit.

30. A substrate processing apparatus according to claim 8, further comprising:

a buffer for temporarily storing the substrate; and a control means for controlling the substrate transfer mechanism to transfer the substrate to the buffer, when a time lag occurs between the coating unit, the developing unit, and the etching unit, when a the lag occurs between the coating units, when a time lag occurs between the developing units, or when a time lag occurs between the etching units.

31. A substrate processing apparatus according to claim 8, wherein said cassette portion has a transferring/receiving mechanism for delivering the substrate to the substrate transfer mechanism, and said cassette portion and said linear transfer path are arranged integral.

32. A substrate processing apparatus according to claim 14, further comprising:

a buffer for temporarily storing the substrate; and a control means for controlling the substrate transfer mechanism to transfer the substrate to the buffer, when a time lag occurs between the coating unit, the developing unit, the etching unit, and the film-forming unit, when a time lag occurs between the coating units, when a time lag occurs between the developing units, when a time lag occurs between the etching units, or when a time lag occurs between the film-forming units.

33. A substrate processing apparatus according to claim 8, wherein
said cassette portion has a transferring/receiving mechanism for delivering the substrate to the substrate transfer mechanism, and
said cassette portion and said linear transfer path are provided as one unit.

34. A substrate processing apparatus according to claim 20, further comprising:
a buffer for temporarily storing the substrate and a control means for controlling the substrate transfer mechanism to transfer the substrate to the transfer mechanism, when a time lag occurs between vacuum-processing in the first module and at least either of a former process or a latter process of vacuum-processing in the second module.

35. A substrate processing apparatus according to claim 20, wherein
said cassette portion has a transferring/receiving mechanism for delivering the substrate to the substrate transfer mechanism and said cassette and said linear transfer path are arranged integrally.

* * * * *